(12) United States Patent
Nakashima et al.

(10) Patent No.: US 7,872,194 B2
(45) Date of Patent: Jan. 18, 2011

(54) PHOTOVOLTAIC DEVICE

(75) Inventors: Takeshi Nakashima, Kobe (JP); Eiji Maruyama, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 1013 days.

(21) Appl. No.: 11/092,840

(22) Filed: Mar. 30, 2005

(65) Prior Publication Data

US 2006/0065298 A1    Mar. 30, 2006

(30) Foreign Application Priority Data

Sep. 29, 2004    (JP)    ............................. 2004-283926

(51) Int. Cl.
  *H01L 31/0236* (2006.01)
  *H01L 31/0216* (2006.01)
  *H01L 31/04* (2006.01)
(52) U.S. Cl. .................. 136/252; 136/243; 136/251; 136/256; 136/257; 136/258; 136/259; 136/261
(58) Field of Classification Search .................. None
  See application file for complete search history.

(56) References Cited

U.S. PATENT DOCUMENTS

| 5,401,330 | A | * | 3/1995 | Saito et al. .................. 136/259 |
| 6,127,622 | A | * | 10/2000 | Yamada et al. ............... 136/251 |
| 6,294,722 | B1 | * | 9/2001 | Kondo et al. ................. 136/244 |
| 6,355,353 | B1 | * | 3/2002 | Hyodo et al. ................. 428/432 |

FOREIGN PATENT DOCUMENTS

| JP | 59-47777 | 3/1984 |
| JP | 10-107308 | 4/1998 |
| JP | 2003-347571 | 12/2003 |

OTHER PUBLICATIONS

Maruyama (JP 2003-347571) Machine Translation.*
Japanese Office Action, with English translation, issued in Japanese Patent Application No. JP 2004-283926, mailed Jul. 29, 2008.

* cited by examiner

*Primary Examiner*—Jennifer K Michener
*Assistant Examiner*—Matthew T Martin
(74) *Attorney, Agent, or Firm*—McDermott Will & Emery LLP

(57) ABSTRACT

The present invention provides a photovoltaic device having excellent environmental durability and good adhesion with a collector electrode made of metal paste. The photovoltaic device comprises an ITO film on a p-type amorphous silicon hydride film on a light incident side of the photovoltaic device and a collector electrode made of silver paste on the ITO film. A silicon oxide insulation film made of SiOx is provided on at least regions on the ITO film where the collector electrode is not formed. The thickness of the silicon oxide insulation film is about 1 to 10 times thicker than an arithmetic mean deviation (Ra) of the underlying ITO film. The silicon oxide insulation film is a film having a Si-2p peak with a full width at half maximum of 2.45 or less, which is evaluated by an X-ray photoelectron spectroscopy.

5 Claims, 6 Drawing Sheets

PHOTOVOLTAIC DEVICE

The priority application Number 2004-283926 upon which this Patent application is based is hereby incorporated by reference.

BACKGROUND OF THE INVENTION

1. Field of the Invention

The present invention relates to a photovoltaic device, more particularly, to a photovoltaic device provided with a transparent conductive oxide film and a collector electrode on the transparent conductive oxide film and having greater environmental durability and reliability.

2. Description of the Related Art

Since solar power generation systems mounted on a roof has become widespread rapidly, solar cells with greater environmental durability and environmental reliability than that of conventional home-use solar cells are required recently. Generally, the structures of solar cell modules are designed so as to obtain sufficient environmental durability, but more preferably, photoelectric conversion elements in the solar cell modules should possess excellent environmental durability and reliability. In a photovoltaic device using a comb-shaped metal electrode and a transparent conductive oxide film comprised of indium tin oxide (Sn-doped $In_2O_3$: ITO) or zinc oxide (ZnO) on the light incident side, for example, high reliability in moisture resistance and alkaline resistance is required to not only semiconductor layers but also the transparent conductive oxide film.

A highly effective transparent conductive oxide film needs high light-transmittance and low electric resistance together. Generally, a high crystallinity is necessary for transparent conductive film to obtain the high light-transmittance and the low electric resistance. However, because ITO films and ZnO films are polycrystals, their grain boundaries are affected with an increase in size of their crystal grains. That is, the grain boundaries work as a path to accelerate alkaline to leach out from glass, thereby causing a possible decrease in the environment durability and reliability.

In order to solve the problem, a method of laminating two kinds of ITO films each having different crystal orientation has been proposed to realize high reliability. (e.g. Japanese unexamined patent publication No. 2003-347571). Also, photoelectric conversion device in which after forming photovoltaic elements, a light incident side of the elements is covered with a resin moist-proof film has been proposed (e.g. Japanese unexamined patent publication No. 1998-107308).

The photovoltaic devices disclosed in the above-mentioned publications achieve the high reliability, but no description has been made on adhesion property of collector electrodes therein. Further improvement of the adhesion property is necessary.

SUMMARY OF THE INVENTION

The present invention has an object to solve the problems and obtain a highly reliable and effective photoelectric conversion device.

The present invention is directed to a photovoltaic device provided with a transparent conductive oxide film on a light incident side of the photovoltaic device and a collector electrode on the transparent conductive oxide film, and characterized in that: a silicon oxide insulation film serving as a light-transmitting protective film is provided on at least regions where the collector electrode is not formed on the transparent conductive oxide film; the silicon oxide insulation film is approximately 1 to 10 times thicker than an arithmetic mean deviation (Ra) of a surface of the underlying transparent conductive oxide film; and the silicon oxide insulation layer is comprised of a film having a Si-2p peak with a full width at half maximum of 2.45 or less, which is evaluated by an X-ray photoelectron spectroscopy.

The present invention is characterized in that the arithmetic mean deviation (Ra) of the surface of the transparent conductive oxide film is 0.5 nm to 2 nm. An O/Si ratio of the silicon oxide insulation layer should be 1.85 to 2.0.

The collector electrode is comprised of finger portions and a bus bar portion. Semiconductor layers, the transparent conductive oxide film and the light-transmitting protective film are deposited in this order in effective areas for power generation where the collector electrode is not formed, while the semiconductor layers, the transparent conductive oxide film, the collector electrode and the light-transmitting protective film are deposited in this order in areas where at least the finger portions of the collector electrode are formed.

The present invention is characterized in that the light-transmitting protective film is not provided on the bus bar portions of the collector electrode and a connecting tab is soldered onto the bus bar portion.

In the above-mentioned invention, the arithmetic mean deviation (Ra) of the surface of the transparent conductive oxide film is 2 nm or less, a thickness of the silicon oxide insulation layer is approximately 1 to 10 times thicker than the arithmetic mean deviation (Ra) of the underlying transparent conductive oxide film, and the silicon oxide insulation film has the Si-2p peak with the full width at half maximum of 2.45 or less, which is evaluated by an X-ray photoelectron spectroscopy. Therefore the photovoltaic device has an excellent barrier effect against alkaline, and can obtain high reliability without reduction of adhesion between the collector electrode and transparent conductive oxide film.

The absence of the light-transmitting protective film at a joint part of the bus bar portions and the connecting tab prevent flux oozing and connection failure.

DETAILED DESCRIPTION OF THE PREFERRED EMBODIMENT(S)

Figure 1:
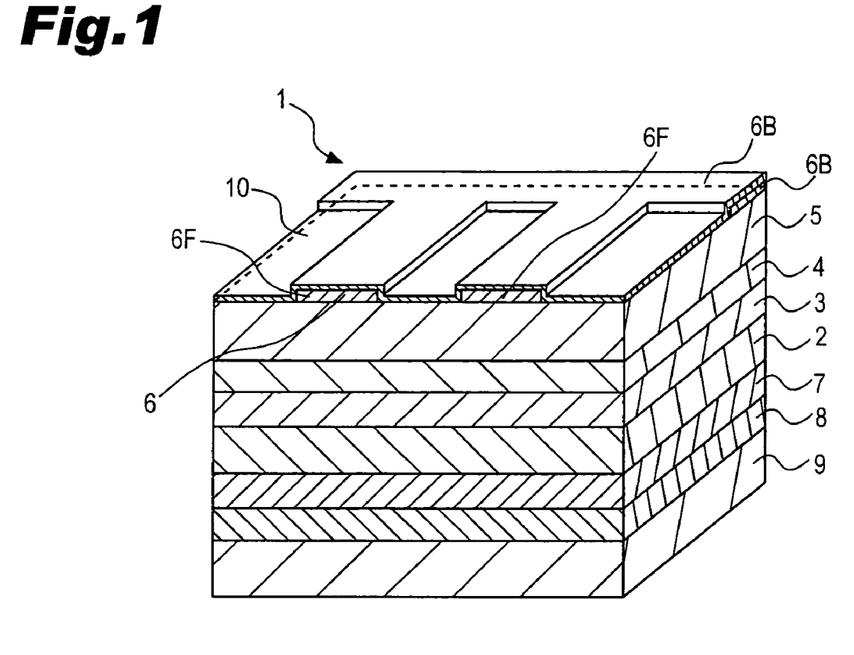
FIG. 1 is a schematic perspective view showing a structure of a photoelectric conversion device according to an embodiment of the present invention.
Figure 2:
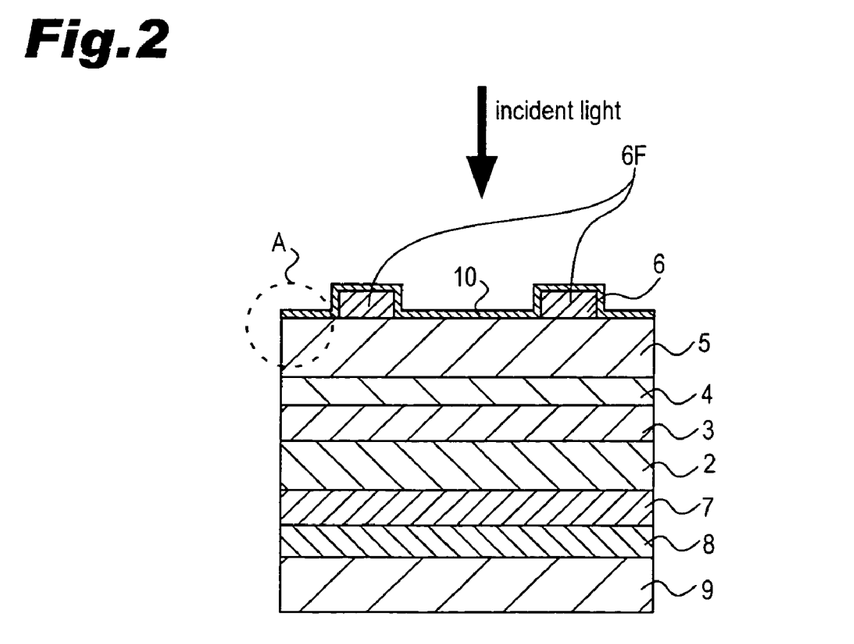
FIG. 2 is a schematic cross-sectional view showing the structure of the photoelectric conversion device according to the embodiment of the present invention.

With reference to drawings, description will be made on an embodiment of the present invention below. FIG. 1 is a schematic perspective view showing a structure of a photoelectric conversion device according to the embodiment of the present invention. FIG. 2 is a schematic cross-sectional view showing the structure of the photoelectric conversion device according to the embodiment of the present invention.

The photoelectric conversion device 1 according to the embodiment, as shown in FIG. 1 and FIG. 2, comprises an n-type single crystal silicon substrate with a (100) plane 2 (hereinafter referred to as n-type single crystal silicon substrate 2) having resistivity of about 1 Ω.cm, and a thickness of about 300 μm. There are pyramidal projections and depressions having a height of a few micro meters to a few tens of micro meters on a surface of the n-type single crystal silicon substrate 2. The projections and depressions are made for confining light. A substantially intrinsic i-type amorphous silicon hydride (a-Si:H) layer 3 having a thickness of about 5 nm is formed on the n-type single crystal silicon substrate 2 by an RF plasma CVD method. In addition, a p-type amorphous silicon hydride film 4 having a thickness of about 5 nm is formed on the i-type amorphous silicon hydride film 3. One example of conditions for forming these layers is shown in Table 1.

In this embodiment, an ITO film 5 having a thickness of about 100 nm is formed on the p-type amorphous silicon hydride film 4 as a transparent conductive oxide film by a magnetron sputtering method. The ITO film 5 is made of $In_2O_3$ with the addition of $SnO_2$. The ITO film 5 has roughness on its surface as small as the arithmetic mean deviation (Ra) of 0.5 nm to 2 nm, more preferably 0.5 nm to 1 nm. The arithmetic mean deviation (Ra) is defined in JIS (Japanese Industrial Standard) B 0601-2001. The arithmetic mean deviation (Ra) is arithmetical mean deviation of the assessed profile Ra which is arithmetic mean of the absolute ordinate values Z(x) within a sampling length (4.2.1).

$$Ra = \frac{1}{l} \int_0^l |Z(x)| \, dx$$

with l=lr according to the case.

If the profile is the roughness profile, Ra is called "arithmetic mean roughness" which is a traditionally familiar term.

In this embodiment, under the definition of JIS B 0601-2001, the arithmetic mean deviation (roughness) Ra was measured by an atomic force microscope (nano scope 3A) of Nihon Veeco KK.

A comb-shaped collector electrode 6, which is a paste electrode, is formed at a predetermined region on an upper surface of the ITO film 5. The collector electrode 6 is made of silver (Ag) fine powder and thermosetting resin. For example, Ag paste with a low-heat curing temperature (250° C. or less), which is a blend of silver (Ag) fine powder and epoxy resin, is used to form finger portions 6F and a bus bar portion 6B of the collector electrode 6 so as to have a height of 10 μm to 30 μm and a width of 100 μm to 500 μm by screen printing. The collector electrode 6 is then heated at 200° C. for 80 minutes. The finger portions 6F are aligned in parallel to each other. The bus bar portion 6B collects electric current flowing through the finger portions 6F.

In this embodiment, a silicon oxide (SiOx ($1.5 \leq x \leq 2$)) film 10 is formed so as to cover the collector electrode 6 on the ITO film 5. The silicon oxide (SiOx ($1.5 \leq x \leq 2$)) film 10 used in this embodiment is formed by RF magnetron sputtering with $SiO_2$ as a target.

As described above, effective areas for generating power without the collector electrode 6 is formed by laminating the p-type amorphous silicon hydride film 4, the ITO film 5, the silicon oxide insulation film 10 in this order on the light incident side of the photoelectric conversion device 1. Alternatively, the area with the collector electrode 6 involves a lamination of the p-type amorphous silicon hydride film 4, the ITO film 5, the collector electrode 6, and the silicon oxide insulation film 10.

In the present invention, it is required that the silicon oxide insulation film 10 is deposited at least on the finger portions 6F of the collector electrode 6. Although, the silicon oxide insulation film 10 is deposited even on the bus bar portion 6B in this embodiment, the silicon oxide insulation film 10 is not necessary to be formed on the bus bar portion 6B as described later.

A substantially intrinsic i-type amorphous silicon hydride film 7 having a thickness of about 5 nm is formed on a lower surface of the n-type single crystal silicon substrate 2. On the i-type amorphous silicon hydride film 7 formed is an n-type amorphous silicon hydride film 8 having a thickness of about 20 nm. Thus, the i-type amorphous silicon hydride film 7 and the n-type amorphous silicon hydride film 8 formed in this order on the lower surface of the n-type single crystal silicon substrate 2 creates the so-called Back Surface Field (BSF) structure. In addition, a rear surface electrode 9, which has a thickness of about 100 nm and is made of Ag for example, is formed on the n-type amorphous silicon hydride film 8.

The configurations of the i-type amorphous silicon hydride film 7 and the n-type amorphous silicon hydride film 8 formed on the lower surface of the n-type single crystal silicon substrate 2 are same as that of the i-type amorphous silicon hydride film 3 and the p-type amorphous silicon hydride film 4 formed on the upper surface of the n-type single crystal silicon substrate 2 respectively, except for the configuration described above. One example of conditions for forming these layers is shown in Table 1.

TABLE 1

| processing | | Gas | | Pressure (Pa) | Power (W) |
|---|---|---|---|---|---|
| Front side | i-type a-Si | $H_2$: | 100 sccm | 20 | 150 |
| | | $SiH_4$: | 40 sccm | | |
| | p-type a-Si | $H_2$: | 40 sccm | 20 | 150 |
| | | $SiH_4$: | 40 sccm | | |
| | | $B_2H_6(2\%)$: | 20 sccm | | |
| Rear side | i-type a-Si | $H_2$: | 100 sccm | 20 | 150 |
| | | $SiH_4$: | 40 sccm | | |
| | n-type a-Si | $H_2$: | 40 sccm | 20 | 150 |
| | | $SiH_4$: | 40 sccm | | |
| | | $PH_3(1\%)$: | 40 sccm | | |

As shown in Table 1, boron (B) was used as a p-type dopant and phosphorus (P) was used as an n-type dopant. Except for this, Al, Ga, and In in the group III elements are available for the p-type dopant, and N, As and Sb in the group V elements are available for the n-type dopant. By mixing compound gas including at least one element described above with source gas such as silane gas ($SiH_4$), valence electrons can be controlled to make the layers p-type or n-type. The amorphous silicon hydride (a-Si:H) can be formed by any known techniques including vapor deposition, sputtering, RF plasma CVD, microwave plasma enhanced CVD, electron cyclotron resonance (ECR), thermal CVD and low pressure CVD (LPCVD). The semiconductor may be crystalline, amorphous, or micro-crystalline Si, SiGe, SiGeC, SiC, SiN, SiGeN, SiSn, SiSnO, SiO, Ge, GeC, or GeN. Note that amorphous materials must include at least hydrogen or fluoride.

Figure 3:
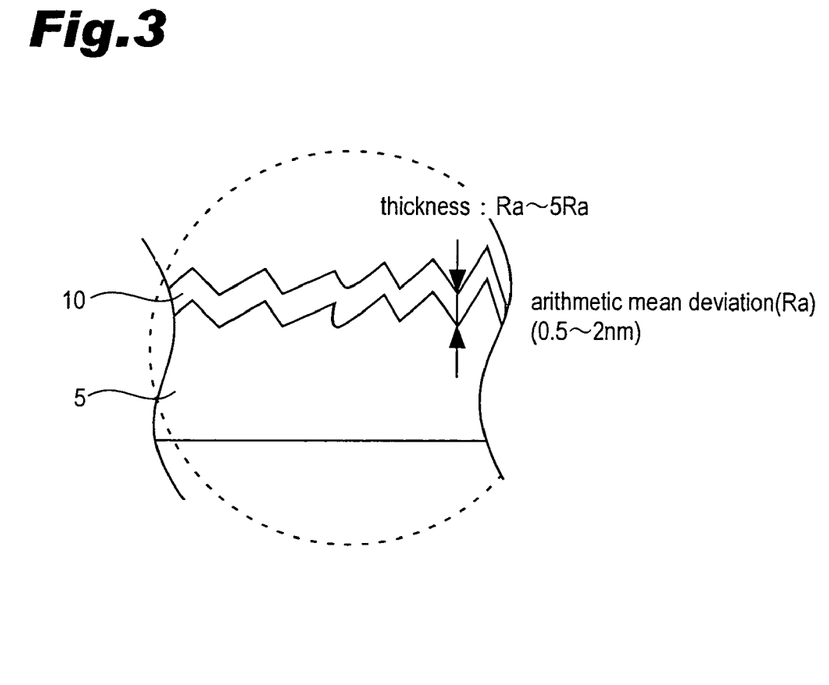
FIG. 3 is an enlarged view showing a structure of a region enclosed by a dotted line A in FIG. 2.

FIG. 3 is an enlarged view showing a structure of a region enclosed by a dotted ling A in FIG. 2. The ITO film 5 is a transparent conductive oxide film having small roughness on its surface; the arithmetic mean deviation (Ra) of the roughness is 0.5 nm to 2 nm, more preferably 0.5 nm to 1 nm. The thickness of the silicon oxide insulation film 10 on the ITO film 5 is desired to be 1 to 10 times thicker than the arithmetic mean deviation (Ra) of the ITO film 5, more preferably 1 to 5 times. Details will be provided below.

As described above, in this embodiment, an indium oxide thin film (ITO) 5, which is doped with tin, is deposited on the p-type amorphous silicon hydride film 4 as a transparent conductive film. Suitable transparent conductive film for the present invention can be formed by the following process.

In this embodiment, indium oxide doped with tin (Sn) (hereinafter referred to as "ITO") is used as a transparent conductive film. In order to form the film, a sintered body containing $In_2O_3$ powder and 5 wt % $SnO_2$ powder is set on a cathode as a target. The target may be doped with at least one of Si, Ge and Ti. These compound powders, in the right amount, are blended with the indium oxide powder and then sintered to form the target. Variation of $SnO_2$ amount can change the amount of Sn in the ITO. Preferable amount of Sn to In is 1 atomic % to 10 atomic %, more preferably 2 atomic % to 7 atomic %. A preferable sintered density of the target is 90% or more.

In order to prevent plasma damages on the film during formation, a device provided with magnets that can apply a strong magnetic field of 300 to 3000 Gauss onto a surface of the cathode is used. A substrate with predetermined silicon layers formed is mounted in parallel to the cathode so as to oppose to each other. A camber is exhausted to be vacuum, and the substrate of the device is heated from a room temperature to 200° C. by a heater. While a mixed gas of argon (Ar) and oxygen ($O_2$) flows and pressure is maintained at 0.4~1.3 Pa, the cathode starts electrical discharge with a supply of 0.5 to 2 kW DC power. The film is formed at a deposition rate of about 10 to 80 nm/min in a state where the substrate is standing still at a position opposing to the cathode. Except for Ar, inactive gas such as He, Ne, Kr, or Xe, or compound gas of these gases can be used. The gas discharge can be performed by pulsed DC discharge, RF, VHF or microwave discharge.

In the next place, it was examined how the arithmetic mean deviation (Ra) of the surface of the ITO film 5 affects reliability of the photoelectric conversion device 1. For this purpose, a plurality of photoelectric conversion devices 1 with ITO films 5 having a thickness of 100 nm but being different in the arithmetic mean deviation (Ra) are prepared as samples, and the plurality of samples are simply modularized. In the simplified module, nine samples are arranged 3 by 3 and are connected in series to adjacent photoelectric conversion devices 1 via a connecting tab, which is a flat copper foil. A plurality of photoelectric conversion device connected by the connecting tab are sealed between a front surface protective member, which is a glass substrate, and a rear surface protective member, which has a three-layer structure of Polyethylene Terephthalate (PET)/aluminum foil/PET, with Ethylene Vinyl Acetate (EVA) sealant.

Figure 4:
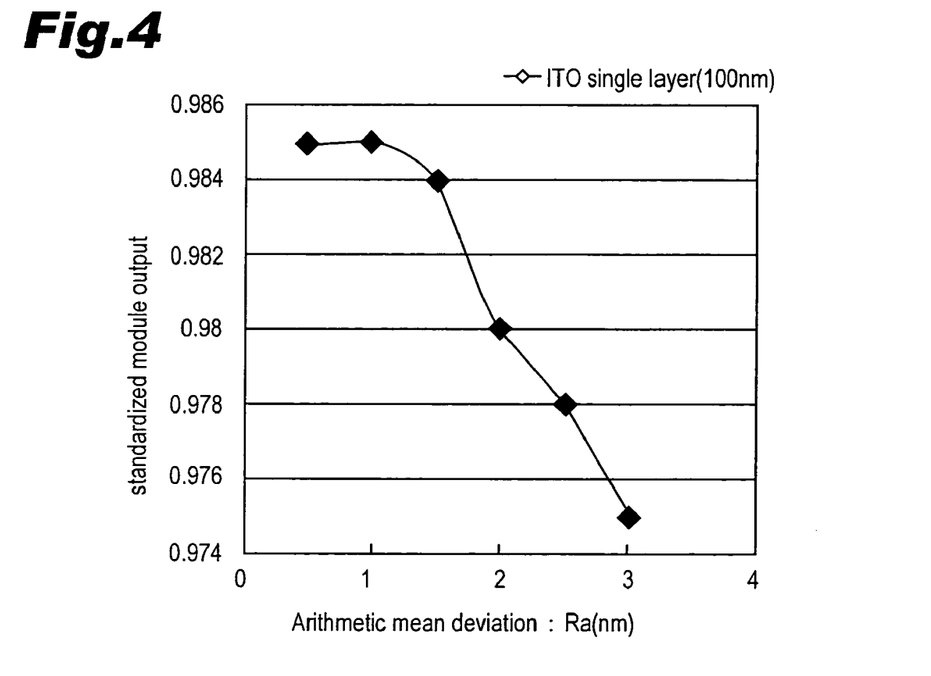
FIG. 4 is a characteristic diagram showing a relationship between arithmetic mean deviations (Ra) of ITO films and standardized module outputs obtained by standardizing outputs of simplified modules after a constant temperature and humidity test by outputs of simplified modules before the test.

Outputs of each simplified module using different type of samples were evaluated before and after a constant temperature and humidity test (humidity: 85%, temperature: 85° C., time period: 1000 hours). FIG. 4 shows a relationship between the arithmetic mean deviation (Ra) of the ITO film and outputs obtained by standardizing outputs of the simplified modules after the constant temperature and humidity test by outputs of the simplified modules before the test (hereinafter referred to as "standardized module outputs").

As apparent from FIG. 4, the standardized module outputs tend to decrease with an increase in the arithmetic mean deviation (Ra) of the ITO film 5. Regarding IV characteristics of the solar cell module, open circuit voltages (Voc) of the standardized modules decrease with the increase in the arithmetic mean deviation (Ra) of the ITO film 5. This result is believed to be pertinent to the following: because the ITO film having a high arithmetic mean deviation (Ra) has a small crystal orientation but various surface orientations, its grain boundary density becomes high, thereby causing alkaline component to enter the photoelectric conversion device (solar cell) through the grain boundary.

Figure 5:
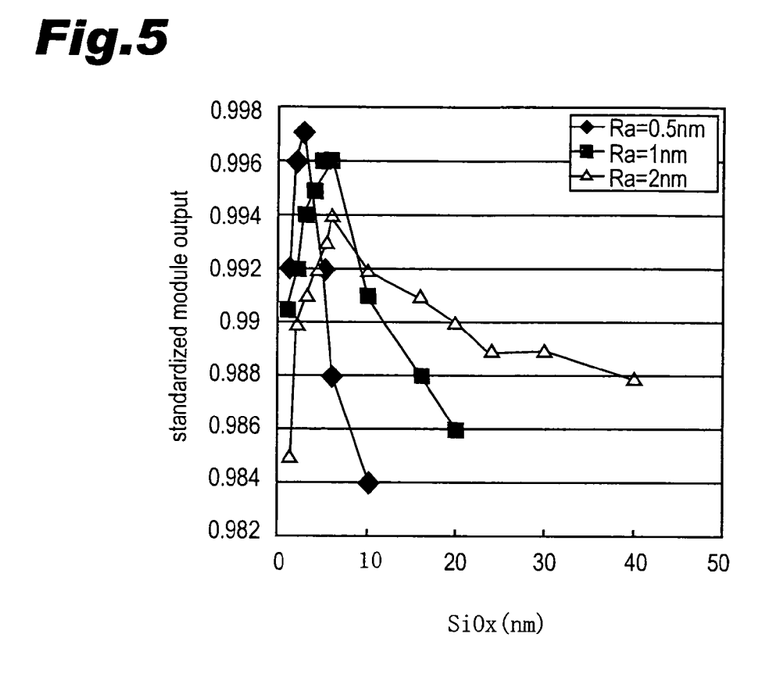
FIG. 5 is a characteristic diagram showing a relationship between thicknesses of light-transmitting protective films and standardized module outputs obtained by standardizing the outputs of simplified modules after a constant temperature and humidity test by outputs of simplified modules before the test. The simplified modules include ITO films each having the arithmetic mean deviation (Ra) of 0.5 nm, 1 nm, and 2 nm, respectively.

Furthermore, sample photoelectric conversion devices 1 having ITO films 5 with an arithmetic mean deviation (Ra) of 0.5 nm, 1 nm, or 2 nm and silicon oxide insulation films 10 of different thicknesses are prepared to form a plurality of simplified modules. FIG. 5 shows a relationship between the thicknesses of the silicon oxide insulation films 10 and standardized module outputs obtained by standardizing outputs of the simplified modules after a constant temperature and humidity test by outputs of the simplified modules before the test.

The samples were formed in the following process: ITO films 5 with an arithmetic mean deviation (Ra) of 0.5 nm, 1 nm, and 2 nm were prepared; and a silicon oxide insulation film 10 was formed with the use of a $SiO_2$ target by RF magnetron sputtering at a substrate temperature of 200° C., an Ar flow rate of 200 sccm, pressure of 1.36 Pa and a deposition rate of 0.125 nm/s. Thus a plurality of samples having silicon oxide insulation layers 10 of different thicknesses were prepared.

After ascertaining that the layer of 40 nm in thickness was formed in 320 seconds through a picture taken by a transmission electron microscope, the deposition rate was obtained by calculation. The samples with the films having thicknesses from 1 to 40 nm were formed on the basis of the deposition rate, in other words, the thicknesses were converted by multiplying the deposition rate by deposition time. The structure of the embodiment in the present invention is embodied with the formed samples with the SiOx ($1.5 \leq x \leq 2$) films. There are shown the relationship between the thicknesses of the SiOx and the standardized module outputs obtained by standardizing the outputs of the simplified modules after a constant temperature and humidity test by the outputs of the simplified modules before the test.

As apparent form FIG. 5, there is a thickness of the silicon oxide insulation film 10 maximizing the standardized module outputs.

Figure 6:
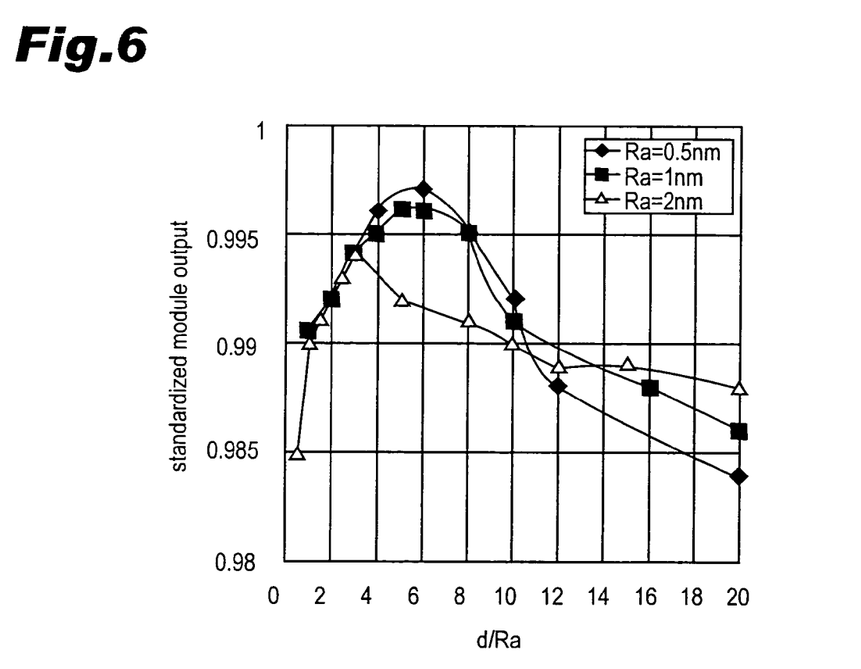
FIG. 6 is a characteristic diagram showing a relationship between d/Ra obtained by dividing thicknesses d of the light-transmitting protective films in FIG. 5 by the arithmetic mean deviation (Ra) of the assessed profile of the ITO film 5 and standardized module outputs obtained by standardizing outputs of the simplified module after a constant temperature and humidity test by outputs of simplified modules before the test.

FIG. 6 shows a relationship between d/Ra obtained by dividing thicknesses d of the silicon oxide insulation films 10 in FIG. 5 by the arithmetic mean deviation (Ra) of the surface of the ITO film 5 and standardized module outputs obtained by standardizing outputs of the simplified module after a constant temperature and humidity test by outputs thereof before the test.

As appreciated from FIG. 6, in order to realize excellent reliability as much as a standardized module output of 0.99 or more, d/Ra=1, in other words, the thickness of the light-transmitting protective film should be as thick as or thicker than the arithmetic mean deviation (Ra) of the ITO film. This is believed that the light-transmitting protective film needs certain thickness to effectively cover the entire surface. The standardized module output achieves 0.99 or more when $1 \leq d/Ra \leq 10$, but the standardized module output is less than 0.99 when d/Ra>10. This can be pertinent to a total of residual stress of the SiOx film as a silicon oxide insulation film 10 and residual stress between the metal paste collector electrode 6 and the ITO film 5, and adhesion between the collector electrode 6 and the ITO film 5. Thus, it is believed that as the arithmetic mean deviation (Ra) becomes higher, the stress is diffused more. Alternatively, it is believed that the results reflect high adhesion level between the metal paste and the ITO due to a lot of hydroxyl radical on the surface of the ITO film 5. The higher residual stress becomes, the lower adhesion becomes. On the other hand, as the stress is diffused more, the adhesion improves more.

The standardized module output is 0.99 or more when $1 \leq d/Ra \leq 10$, furthermore, the standardized module output is 0.995 or more when $0.5 \text{ nm} \leq Ra \leq 1 \text{ nm}$ and $4 \leq d/Ra \leq 8$.

Two kinds of low-heat thermosetting Ag pastes whose curing temperature is 250° C. or less were used this time. Resin material of one of Ag pastes contains 70 wt. % epoxy resin, and another contains 100 wt. % epoxy resin. The results of the test using these Ag pastes showed a same tendency.

Next, a silicon oxide (SiOx) insulation film 10 was formed on an ITO film 5 using an $SiO_2$ target by RF magnetron sputtering at an Ar flow rate of 200 sccm and a pressure of 1.36 Pa. An oxygen flow rate and substrate temperature were altered from 0 to 25 sccm and from a room temperature to 200° C., respectively to form silicon oxide (SiOx) insulation films 10 under the above condition. The films were evaluated by an X-ray photoelectron spectroscopy (hereinafter, referred to as just "XPS"). The ITO film 5 on which the silicon oxide (SiOx) insulation film 10 is formed has an arithmetic mean deviation (Ra) of 0.5 nm.

An O/Si ratio (corresponding to x of SiOx) relating to the quality of SiOx and a full width at half maximum (hereinafter referred to as "FWHM") of a Si-2p peak are focused to consider the reliability of modules.

ESCA 5600 of ULVAC-PHI, Inc. was used for the XPS analysis. An Mg K-alpha X-ray (400 W, 14 kV) was used. Pass energy is 23.5 eV. The measurement was made after sputtering SiOx for 0.2 minutes at a sputtering rate of 10 nm/min. Specific sputtering conditions are: accelerating voltage: 4 kV, emission current: 25 mA, pressure: $15 \times 10^{-3}$ Pa, sputtering size: 2×3 mm. The films were measured at a plurality of points by the XPS and the measured values were averaged out.

Figure 7:
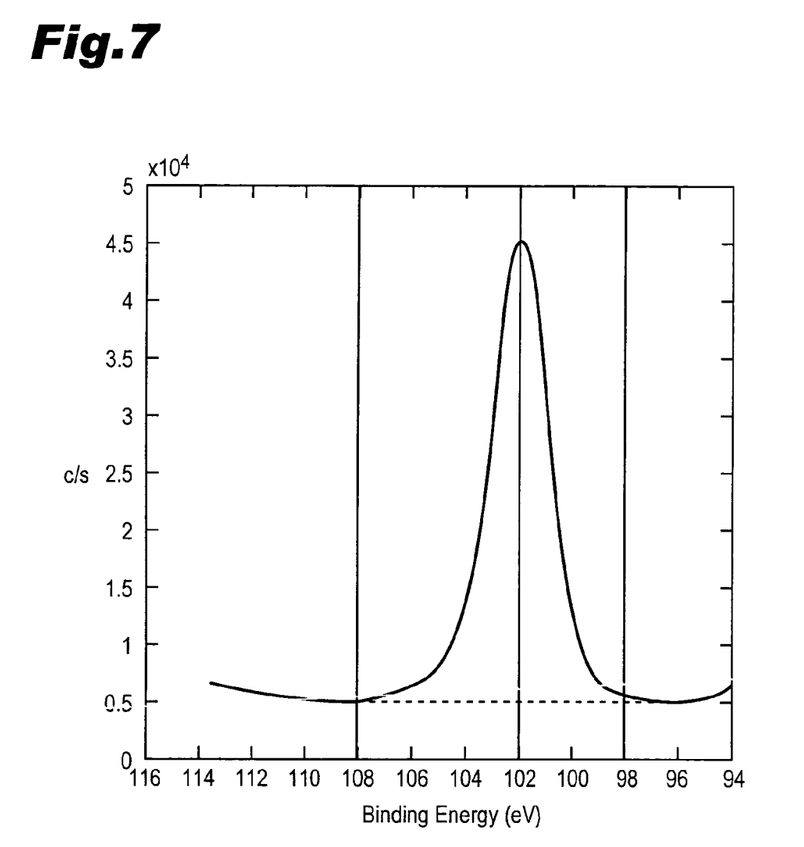
FIG. 7 is a plot showing exemplary measured values of an XPS spectrum of an SiOx film used for the present invention.

The FWHM was taken from a Si-2p peak appeared around 102 eV. The background was subtracted by Shirley method. While the Si-2p peak is shifted to 102.0 eV, the background takes the shape of a straight line drawn between measurement values 96 eV and 108 eV during the calculation. FIG. 7 shows one example of XPS spectra. The example is an XPS spectrum of a silicon oxide (SiOx) insulation film 10 formed at an oxygen flow rate of 5 sccm and at a substrate temperature of 150° C.

To calculate the O/Si ratio, the Si-2p peak and an O-1 s peak appeared around 531.5 eV were used. Silicon content and oxygen content were quantified by using their peak count and sensitivity coefficient in their own energy range: for silicon the energy range is 96 eV to 108 eV, which was used for obtaining the FWHM; and for oxygen the energy range is 526.5 eV to 536.5 eV while the O-1 s peak is shifted to 531.5 eV.

Table 2 shows calculation results of the FWHM of the Si-2p peak and the O/Si ratio of sample SiOx films formed under different conditions.

TABLE 2

|  | Oxygen flow rate | Substrate temperature | O/Si ratio | FWHM |
|---|---|---|---|---|
| Sample 1 | 0 | 200 | 1.87 | 2.41 |
| Sample 2 | 5 | 200 | 1.91 | 2.41 |
| Sample 3 | 5 | 180 | 1.90 | 2.45 |
| Sample 4 | 5 | 150 | 1.91 | 2.49 |
| Sample 5 | 10 | 200 | 1.94 | 2.39 |
| Sample 6 | 10 | 180 | 1.95 | 2.43 |
| Sample 7 | 10 | 150 | 1.93 | 2.47 |
| Sample 8 | 20 | 200 | 2.00 | 2.38 |
| Sample 9 | 20 | 180 | 1.98 | 2.39 |
| Sample 10 | 25 | 200 | 1.94 | 2.41 |
| Sample 11 | 25 | 180 | 1.89 | 2.42 |
| Sample 12 | 25 | RT | 1.88 | 2.46 |

As apparent from Table 2, when the oxygen flow rate is increased to grow the SiOx film, the concentration of oxygen in a film increases, whereby tending to narrow the FWHM. In contrast to this, oxygen content in a film decreases with the excess oxygen flow rate; as a result the FWHM also tends to be narrower. Furthermore, with an increase in substrate temperature, oxygen content in the film becomes constant and the FWHM tends to be narrower.

Thus, the oxygen content and the FWHM can be controlled by controlling the oxygen flow rate and substrate temperature during the SiOx film formation.

Figure 8:
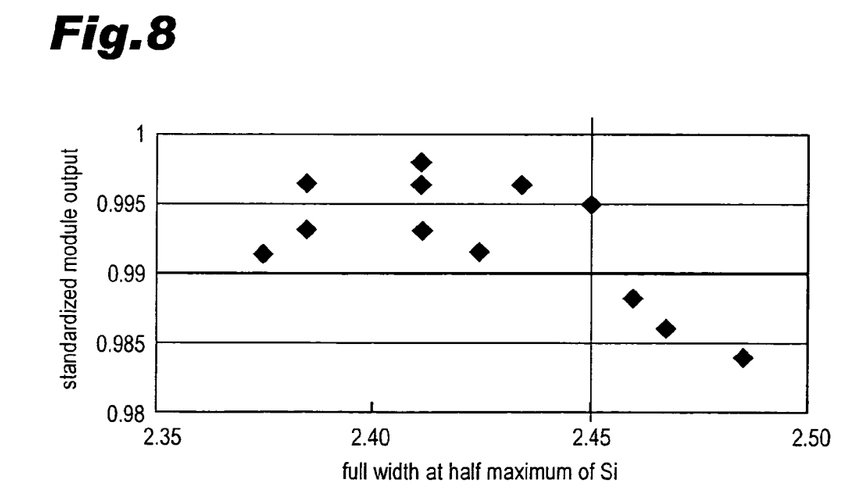
FIG. 8 is a characteristic diagram showing a relationship between a full width at half maximum of a Si-2p peak and standardized module outputs.

Thus controlled various SiOx films 10 are deposited on the ITO films 5 with the arithmetic mean deviation (Ra) of 0.5 nm so as to have a thickness of 8 Ra, and simplified modules are formed in the above described manner. Then standardized module outputs obtained by standardizing outputs of the simplified modules after a constant temperature and humidity test by outputs of the simplified modules before the test. FIG. 8 shows a relationship between the FWHMs of Si-2p peaks and standardized module outputs. As shown in FIG. 8, when the FWHM is 2.45 or less, the standardized module outputs are 0.99 or more, which are excellent results. However no direct correlation was found between standardized module outputs and the FWHMs of 2.45 or less.

Figure 9:
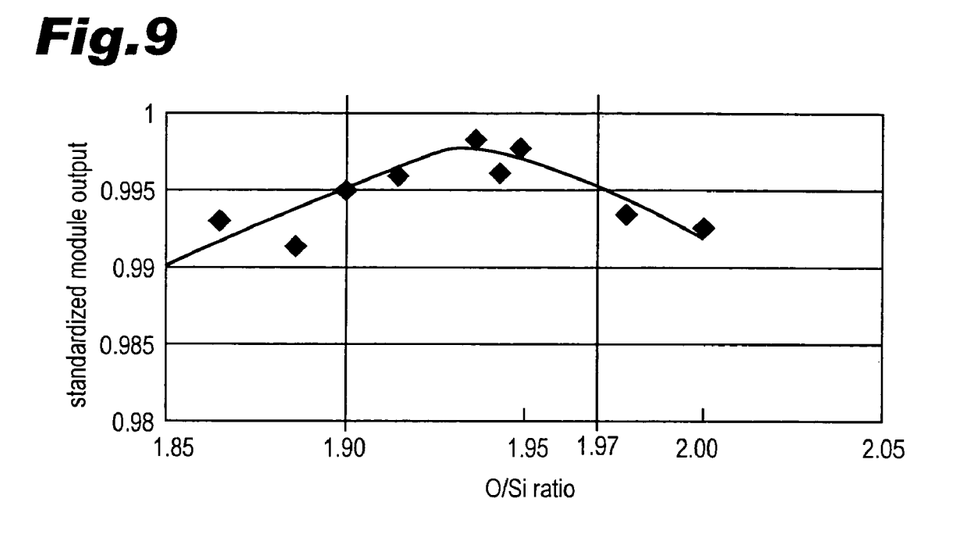
FIG. 9 is a characteristic diagram showing a relationship between an O/Si ratio and standardized module outputs.

Thus, the correlation between an O/Si ratio and a standardized module output was examined for the samples with the FWHM of 2.45 or less. The results are shown in FIG. 9. As shown in FIG. 9, when the O/Si ratio is in a range between 1.90 and 1.95, the standardized module outputs are 0.995 or more, which are excellent values. As appreciated from the results, when the FWHM of the Si-2p peak is 2.45 or less and the O/Si ratio is 1.9 to 2.0, high standardized module outputs can be obtained. Therefore by forming the SiOx film 10 so as to have the FWHM of the Si-2p peak of 2.45 or less and the O/Si ratio of 1.90 to 1.95, a highly durable module having a standardized module output of 0.995 or more can be provided.

Figure 10:
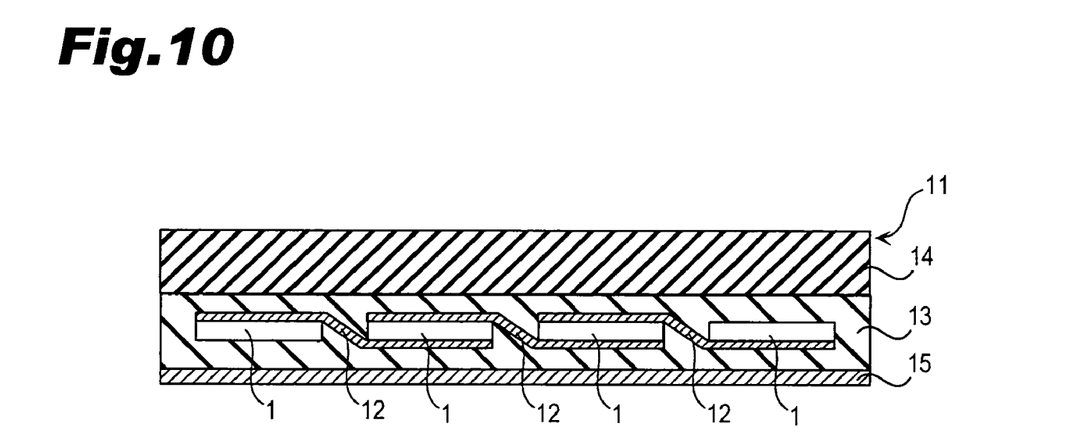
FIG. 10 is a cross-sectional view of a solar cell module using the photovoltaic device according to the present invention.

FIG. 10 shows modularized photoelectric conversion devices of the present invention. As shown in FIG. 10, the solar cell module comprises a plurality of photoelectric conversion devices 1. Each photoelectric conversion device 1 is connected in series to adjacent photoelectric conversion devices 1 via a flat copper connecting tab 12. One end of the connecting tab 12 is connected to a collector electrode 6 on an upper surface of a photoelectric conversion device 1 (see FIG. 1), while another end of the connecting tab 12 is connected to a rear surface electrode 9 of another photoelectric conversion device 1 adjacent to the photoelectric conversion device 1 (see FIG. 1).

The plurality of photoelectric conversion devices 1 connected by the connecting tab 12 are covered by EVA sealant 13. On an upper surface of the sealant 13 provided is a front surface protective member 14, which is a glass substrate. On a lower surface of the sealant 13 provided is a rear surface protective member 15 having a three-layer structure of PET/aluminum foil/PET.

In order to connect the photoelectric conversion devices 1 of the present invention to each other through the connecting tab 12 such as a copper foil and a bus bar portion 6B, it is necessary to solder the connecting tab 12 to the bus bar portion 6B without any deleterious effect on the underlying amorphous semiconductor layer. For this purpose, a flux is often used for soldering. However, in the case where the silicon oxide insulation film 10 is provided over the bus bar portions 6B as shown in FIG. 1, the flux that is applied on the connecting tab is apt to permeate the silicon oxide insulation film 10, or cause a contact failure.

Figure 11:
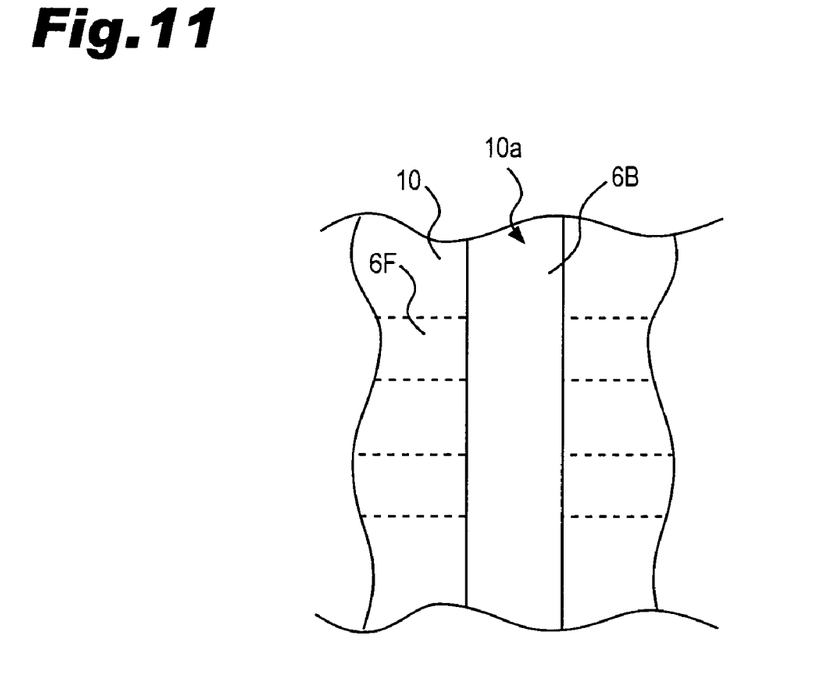
FIG. 11 is a schematic plan view showing a structure of a photoelectric conversion device according to another embodiment of the present invention.
Figure 12:
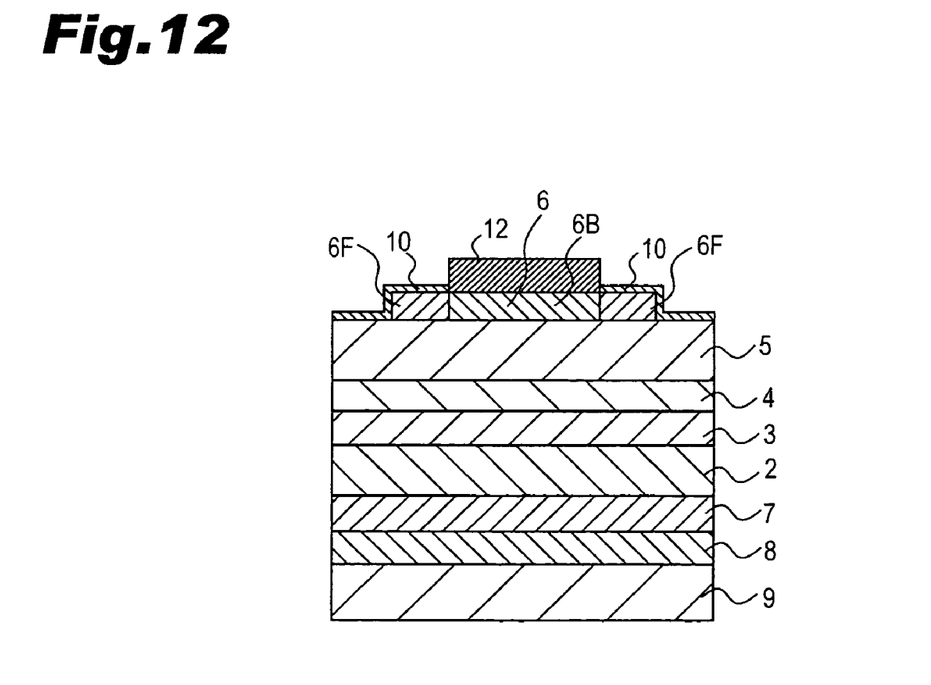
FIG. 12 is a schematic cross-sectional view showing a structure of the photoelectric conversion device according to another embodiment of the present invention.

In another embodiment of the present invention shown in FIG. 11 and FIG. 12, the silicon oxide insulation film 10 is not provided on the bus bar portions 6B to which the connecting tab 12 connects; in other word, a region 10a without the light-transmitting protective film is formed. Then the silicon oxide insulation film 10 is provided on the finger portions 6F and entire surface of the ITO film 5. With this structure, because the light-transmitting protective film is not formed on the bus bar portions 6B, the flux permeation does not occur during soldering of the connecting tab 12 with the flux, thereby making a firm connection between the connecting tab 12 and the bus bar portions 6B.

In order to confirm the effect of the embodiment shown in FIG. 11 and FIG. 12, three samples were prepared: (1) the silicon oxide insulation film (SiOx) 10 is formed on the entire surface of the ITO film 5 including the collector electrode 6; (2) the silicon oxide insulation film (SiOx) 10 is not formed on the bus bar portions 6B to which the connecting tab is connected, but the silicon oxide insulation film (SiOx) 10 is formed on the other part of the collector electrode 6 and ITO film; and (3) the silicon oxide insulation film (SiOx) 10 is not provided at all. The properties of the samples were then compared.

Table 3 shows comparison results of the properties of the photoelectric conversion devices including samples (1) to (3). In Table 3, the sample (3) was standardized to be 1.

TABLE 3

|  | Voc | Isc | F.F. | Pmax |
| --- | --- | --- | --- | --- |
| SiOx film on entire ITO film and collector electrode | 99.9% | 100.1% | 99.9% | 100.0% |
| No SiOx film | 100.3% | 100.1% | 100.0% | 100.4% |

In any conditions, reduction of the fill factor (F.F.) is very little. This means that series resistance does not increase when a load is applied for connection irrespective to that the silicon oxide insulation film 10 exists on the bus bar 6B. It is considered that there are many parts of bus bar portions 6B that are not substantially covered with the silicon oxide insulation film 10 because the silicon oxide insulation film 10 is very thin in comparison with the projections and depressions of the bus bar portions 6B.

In the next place, flux is applied to the bus bar portions 6B of these photovoltaic devices and a connecting tab is soldered to each device. As a result, the flux used in the samples (2) and (3) does not ooze and the connecting tab can be connected without problems. On the other hand, the flux used in the sample (1) oozes, and adhesion of soldering is not sufficient. In other words, it was difficult to form a module with the sample (1). Although the sample (1) was modularized with extra care, the module was disfigured due to oozing of flux, causing deterioration of module property, especially reduction of the fill factor.

Table 4 shows evaluation results of outputs of the sample (2) (no silicon oxide insulation film (SiOx) 10 on the bus bar portions) that were taken before and after a constant temperature and humidity test (humidity: 85%, temperature: 85° C., time period: 1000 hours). The output of the sample (3) without the silicon oxide insulation film (SiOx) 10 is standardized to be 1 herein.

TABLE 4

|  | Voc | Isc | F.F. | Pmax |
| --- | --- | --- | --- | --- |
| Photovoltaic element with SiOx film | 103.6% | 102.5% | 110.6% | 117.7% |

From Table 4, it is found that a photoelectric conversion device with excellent durability can be obtained even if the light-transmitting protective film is not formed on the bus bar portions 6.

The results reach the following conclusion. As shown in another embodiment of the present invention, the structure in which the light-transmitting protective film is not formed on the bus bar portions 6 can obtain excellent durability, which is inherently a function of the protective film and easy manufacture of modules, especially when soldering process is carried out with the use of flux.

Descriptions were made on photovoltaic devices with a junction of amorphous silicon and single crystal silicon in the embodiments, the present invention is not limited to the photovoltaic device if the photovoltaic device is formed through a process of covering with a protective film, especially if an output electrode (connecting tab) is connected to the electrode of the photovoltaic device with the use of flux.

What we claim is:

1. A photovoltaic device provided with a transparent conductive oxide film on a light incident side of the photovoltaic device and a collector electrode on the transparent conductive oxide film, wherein:

a silicon oxide film serving as a light-transmitting protective film is provided on at least regions where the collector electrode is not formed on the transparent conductive oxide film, the silicon oxide film being directly provided on the transparent conductive oxide film in the regions;

an arithmetic mean deviation (Ra) of a surface of the transparent conductive oxide film is less than 1.0 nm and more than 0 nm;

the silicon oxide film is approximately 1 to 10 times thicker than the arithmetic mean deviation (Ra) of the surface of the underlying transparent conductive oxide film; and the silicon oxide film is comprised of a film having a Si-2p peak with a full width at half maximum of 2.45 eV or less evaluated by an X-ray photoelectron spectroscopy.

2. The photovoltaic device of claim 1, wherein an O/Si ratio of the silicon oxide film is 1.85 to 2.0.

3. The photovoltaic device of claim 1, wherein:

the collector electrode is comprised of finger portions and a bus bar portion;

semiconductor layers, the transparent conductive oxide film and the light-transmitting protective film are deposited in this order in effective areas for power generation where the collector electrode is not formed; and the semiconductor layers, transparent conductive oxide film, the collector electrode and the light-transmitting protective film are deposited in this order in areas where at least the finger portions of the collector electrode are formed.

4. The photovoltaic device of claim 3, wherein the light-transmitting protective film is not provided on the bus bar portion of the collector electrode, a connecting tab is soldered onto the bus bar portion, and the collector electrode is formed with an paste electrode.

5. The photovoltaic device of claim 1, wherein the arithmetic mean deviation (Ra) of the surface of the transparent conductive oxide film is 0.5 nm to less than 1.0 nm, and the silicon oxide film is approximately 4 to 8 times thicker than an arithmetic means deviation (Ra) of a surface of the underlying transparent conductive oxide film.

* * * * *